United States Patent
Ritter et al.

[11] Patent Number: 5,889,445
[45] Date of Patent: Mar. 30, 1999

[54] MULTILAYER CERAMIC RC DEVICE

[75] Inventors: Andrew P. Ritter; John L. Galvagni, both of Surfside Beach, S.C.

[73] Assignee: AVX Corporation, Myrtle Beach, S.C.

[21] Appl. No.: 898,695

[22] Filed: Jul. 22, 1997

[51] Int. Cl.[6] ............................................ H03H 1/02
[52] U.S. Cl. ................................. 333/172; 361/321.2
[58] Field of Search ...................... 333/172; 361/321.1, 361/321.2

[56] References Cited

U.S. PATENT DOCUMENTS

| | | | |
|---|---|---|---|
| 2,405,515 | 8/1946 | Neyzi | 333/24 R |
| 2,694,185 | 11/1954 | Kodama | 333/172 |
| 2,779,975 | 2/1957 | Lee | 427/79 |
| 2,828,454 | 3/1958 | Khouri | 333/172 |
| 3,002,137 | 9/1961 | Kahn et al. | 361/321.1 |
| 3,256,588 | 6/1966 | Sikina et al. | 333/172 |
| 3,490,055 | 1/1970 | Cox | 333/172 |
| 3,544,925 | 12/1970 | Swart et al. | 333/172 |
| 3,569,795 | 3/1971 | Gikow | 361/434 |
| 3,569,872 | 3/1971 | Berlin | 333/172 |
| 3,619,220 | 11/1971 | Maher | 501/137 |
| 3,859,592 | 1/1975 | Kessler | 333/172 |
| 3,896,354 | 7/1975 | Coleman et al. | 361/321.2 |
| 4,720,766 | 1/1988 | Honda | 361/275 |
| 4,800,459 | 1/1989 | Takagi et al. | 361/321.1 |
| 5,021,921 | 6/1991 | Sano et al. | 361/321.1 |
| 5,093,774 | 3/1992 | Cobb | 361/306 |
| 5,157,582 | 10/1992 | Sugita et al. | 361/321.1 |
| 5,227,951 | 7/1993 | Deneuf et al. | 361/321.1 |
| 5,258,335 | 11/1993 | Muralidhar et al. | 501/20 |
| 5,430,605 | 7/1995 | Deneuf et al. | 361/321.1 |
| 5,495,387 | 2/1996 | Mandai et al. | 333/172 X |

FOREIGN PATENT DOCUMENTS

| | | |
|---|---|---|
| 0379404 | 7/1990 | European Pat. Off. . |
| 0581206 | 2/1994 | European Pat. Off. ............ 361/321.2 |
| 0751571A2 | 1/1997 | European Pat. Off. . |
| 6-267789 | 9/1994 | Japan .................. 361/321.2 |

*Primary Examiner*—Robert Pascal
*Assistant Examiner*—Justin P. Bettendorf
*Attorney, Agent, or Firm*—Dority & Manning, P.A.

[57] ABSTRACT

Composite RC devices are described that provide predetermined impedance properties in a package similar to multilayer ceramic capacitors of the prior art. The RC devices include a plurality of first and second ceramic layers interleaved to form a stack. The ceramic layers each include a suitable electrode structure of opposite polarity forming the equivalent of multiple two-plate capacitors. One or more resistors are embedded in the device body and are selectively connected to the capacitor structure. In some presently preferred embodiments, multiple parallel resistors are provided, such as on each electrical side of the capacitor structure.

25 Claims, 11 Drawing Sheets

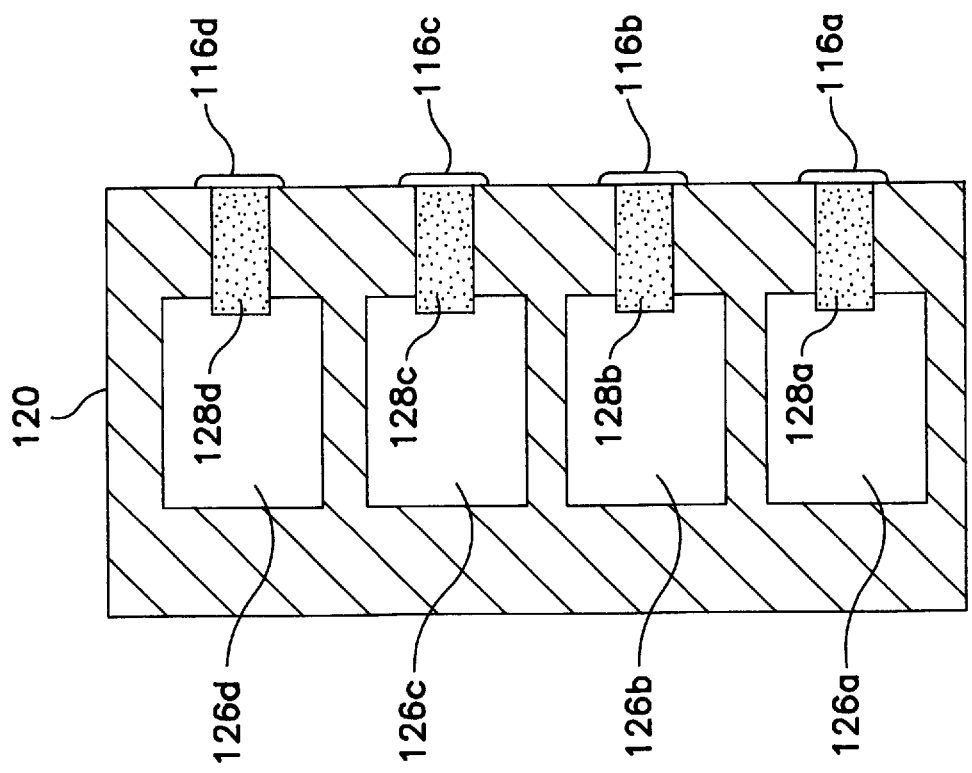
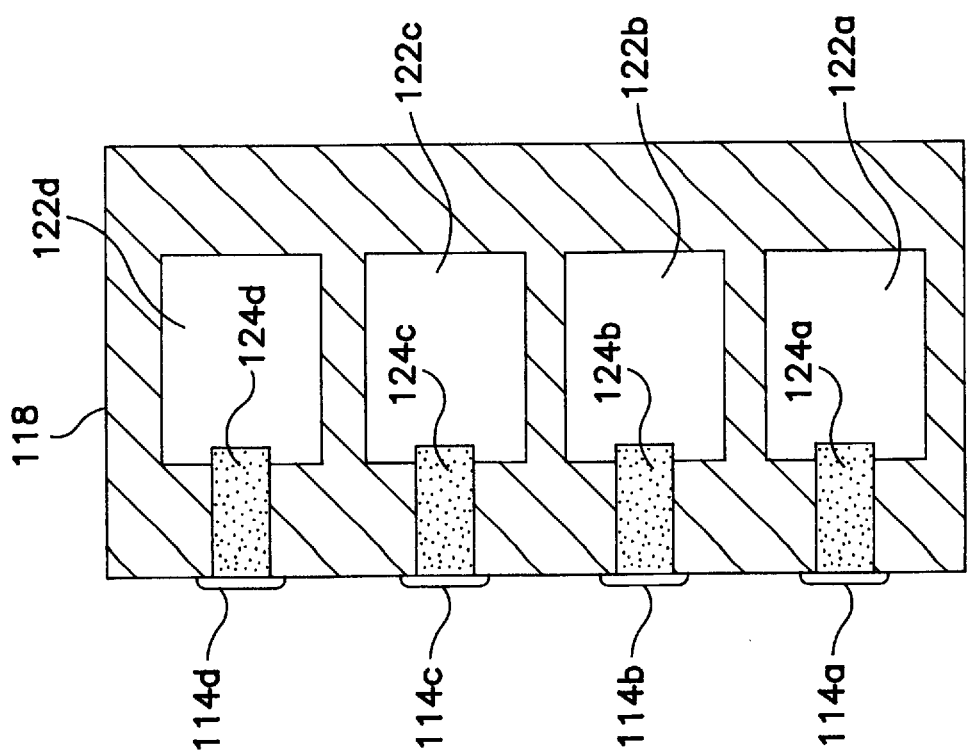

MULTILAYER CERAMIC RC DEVICE

BACKGROUND OF THE INVENTION

The present invention relates generally to electronic components fabricated by multilayer ceramic technology. More particularly, the present invention relates to a multilayer ceramic device having RC properties.

Multilayer ceramic technology is commonly employed in the production of capacitors, known as multilayer ceramic capacitors (MLCs). During manufacture of MLCs, a plurality of ceramic-electrode layers are arranged in a stack. The stacked layers are pressed and sintered to achieve a substantially uniform capacitor body. The capacitor body is often rectangular in shape, with electrical terminals of opposite polarity provided along respective sides or at opposite ends.

As is well known, every other electrode in the interleaved stack is connected to one of the opposite polarity terminals. Each terminal thus provides a common node to a respective set of alternate electrodes. As a result, a capacitor device constructed in this manner will behave as a plurality of discrete capacitors arranged in parallel.

It is often necessary to connect a resistance in series with the capacitance provided by a MLC component. A discrete resistor can be used for this purpose, but is often undesirable due to space limitations frequently imposed by the design of modern electronic equipment.

As an alternative, composite devices have been developed that include a MLC structure in series with an "on-chip" resistor. The MLC structure of these devices is fabricated in a manner similar to discrete MLCs. After the capacitor is made, a resistor is located on the exterior surface of the capacitor body, electrically connected between a terminal and its associated set of electrode plates. A device of this type is illustrated, for example, in U.S. Pat. No. 5,227,951 to deNeuf et al.

While composite RC devices are generally effective for their intended purpose, they are not without certain disadvantages.

SUMMARY OF THE INVENTION

The present invention recognizes various disadvantages of prior art constructions and methods. Accordingly, it is an object of the present invention to provide improved composite RC devices.

It is a more particular object of the present invention to provide improved composite RC devices fabricated by multilayer ceramic technology.

It is a further object of the present invention to provide multilayer composite RC devices utilizing embedded resistors.

It is a further object of the present invention to provide multilayer composite RC devices utilizing a plurality of resistors to achieve tolerance averaging.

It is a further object of the present invention to provide multilayer composite RC devices having resistors on each electrical side of the capacitor structure.

It is also an object of the invention to provide an improved method of manufacturing a multilayer composite RC device.

Some of these objects are achieved by a composite RC device comprising a device body defined by at least one first ceramic layer and at least one second ceramic layer located on the first ceramic layer. Each first ceramic layer has thereon first circuitry defining a first series resistance and a first polarity capacitor electrode. Similarly, each second ceramic layer has thereon second circuitry defining a second series resistance and a second polarity capacitor electrode. First and second polarity terminals are located on the device body and electrically connected to the first circuitry and the second circuitry, respectively.

In some exemplary embodiments, the first circuitry may comprise a first conductive capacitor plate and a first series resistor electrically connected between the first conductive capacitor plate and the first polarity terminal. The second circuitry may comprise a second conductive capacitor plate and a second series resistor electrically connected between the second conductive capacitor plate and the second polarity terminal. The first and second polarity terminals may be located opposite to one another across the device body such that the first resistors are aligned with the second resistors.

In other exemplary embodiments, the first circuitry and the second circuitry may each comprise a resistive material electrically connected to a respective of the first and second terminals and including an electrode plate configuration.

Preferred embodiments of the composite RC device may comprise a plurality of first ceramic layers and a plurality of second ceramic layers interleaved to form a stack. Because the resistors are located inside the capacitor body, the ceramic layers and resistors are fired together in the manufacturing process. The first and second ceramic layers may be made from a low temperature cofirable ceramic (LTCC) material having a firing temperature of less than approximately 850 degrees Celsius.

Other objects of the present invention are achieved by a composite RC device comprising a device body defined by a plurality of first ceramic layers and a plurality of second ceramic layers interleaved to form a stack. Each of the first ceramic layers has a respective first electrode thereon and each of the second ceramic layers has a second electrode thereon. The first and second electrodes are opposed to define a multilayer parallel capacitor structure.

The composite RC device further includes first and second polarity terminals located on the device body. In addition, at least one first resistor is embedded in the device body between an adjacent pair of first and second ceramic layers. The first resistor is electrically connected between the first polarity terminal and at least one of the first electrodes.

In some exemplary embodiments, a plurality of first resistors are electrically connected between the first polarity terminal and respective of the first electrodes. A plurality of second resistors may also be provided, electrically connected between the second polarity terminal and respective second electrodes.

Exemplary embodiments may also be provided wherein each of the first electrodes further comprises at least one lead structure extending therefrom. The lead structure is electrically connected to a third terminal located on the device body. In such embodiments, the second polarity terminal may preferably be electrically connected directly to the second electrodes.

In other exemplary embodiments, the first resistor is electrically connected to an external via located on the device body. The via is further electrically connected to at least one first electrode. For example, the via may be electrically connected to a plurality of first electrodes. In such cases, each of the first electrodes preferably includes a respective lead structure extending to the via.

Still further objects of the present invention are achieved by an array device having a predetermined number of RC circuits in a singular package. The array device comprises a device body defined by a plurality of first ceramic layers and a plurality of second ceramic layers interleaved to form a stack. Each of the first ceramic layers has the predetermined number of first electrodes thereon and each of the second ceramic layers has the predetermined number of second electrodes thereon. The first electrodes are opposed to respective of the second electrodes to define respective multilayer parallel capacitor structures.

The array device further comprises respective first and second polarity terminals, located on the device body, for each of the RC circuits. At least one first resistor is also provided for each of the RC circuits, embedded in the device body between an adjacent pair of first and second ceramic layers. The first resistor is electrically connected between the first polarity terminal and at least one of the first electrodes.

In some exemplary embodiments, the at least one first resistor comprises a plurality of first resistors electrically connected between the first polarity terminal and respective first electrodes. A plurality of second resistors may also be provided for each RC circuit, electrically connected between the second terminal and respective second electrodes. As described above, the first and second ceramic layers may be made from a LTCC material having a firing temperature of less than approximately 850 degrees Celsius.

Additional objects of the invention are achieved by a composite RC device comprising a device body defined by a plurality of first ceramic layers and a plurality of second ceramic layers interleaved to form a stack. The first and second ceramic layers are made from a LTCC material having a firing temperature of less than approximately 850 degrees Celsius. Each first ceramic layer has thereon first circuitry defining a first series resistance and a first polarity capacitor electrode. Similarly, each second ceramic layer has thereon second circuitry defining a second series resistance and a second polarity capacitor electrode. The composite RC device further includes first and second polarity terminals located on the device body and electrically connected to the first circuitry and the second circuitry, respectively.

In some exemplary embodiments, the first circuitry comprises a first conductive capacitor plate and a first series resistor electrically connected between the first conductive capacitor plate and the first polarity terminal. The second circuitry may comprise a second conductive capacitor plate and a second series resistor electrically connected between the second conductive capacitor plate and the second polarity terminal. Alternatively, the first and second circuitry may each comprise a resistive material electrically connected to a respective of the first and second terminals and including an electrode plate configuration.

Other objects of the present invention are achieved by a method of fabricating a composite RC device. One step of the method involves providing a plurality of first layers of ceramic material, each of the first layers having first circuitry thereon including a first electrode and a first resistive element. As an additional step, a plurality of second layers of ceramic material are also provided. Each of the second layers has thereon second circuitry including a second electrode. The first layers and the second layers are stacked to define an interleaved device body such that the first and second electrodes alternate. First and second opposite polarity electrodes are provided on the device body and electrically connected to the first and second circuitry, respectively.

According to exemplary methodology, the second circuitry may further include a second resistive element. Also, the device body will generally be fired prior to application of the electrodes to achieve a substantially unitary structure. It will often be desirable to fire the device body at a temperature of less than approximately 850 degrees Celsius.

Other objects, features and aspects of the present invention are provided by various combinations and subcombinations of the disclosed elements, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which:

FIGS. 7A and 7B are plan views of first and second ceramic layers interleaved in the form of a stack in the RC array of FIG. 7.

Figure 1:
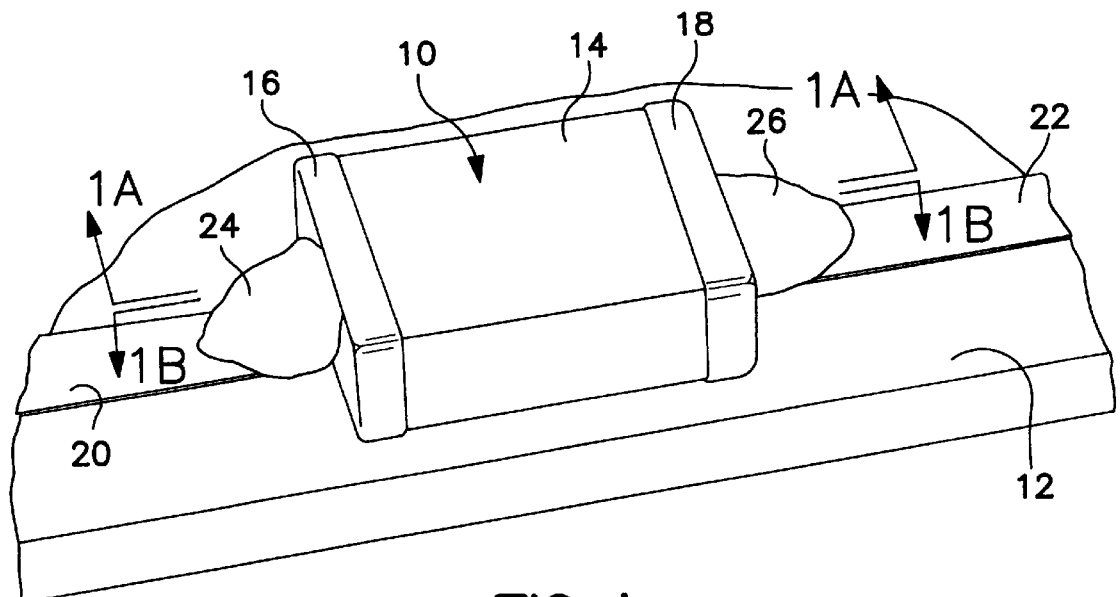
FIG. 1 is a perspective view of a composite RC device constructed in accordance with the present invention in position on a printed circuit board.

Repeat use of reference characters in the present specification and drawings is intended to represent same or analogous features or elements of the invention.

DETAILED DESCRIPTION OF PREFERRED EMBODIMENTS

It is to be understood by one of skill in the art that the present discussion is a description of exemplary embodiments only, and is not intended as limiting the broader aspects of the present invention, which broader aspects are embodied in the exemplary constructions.

FIG. 1 illustrates one embodiment of a composite RC device constructed in accordance with the present invention. In particular, a composite RC device 10 is shown mounted to a printed circuit board 12. Device 10 includes a body 14 having terminals 16 and 18 of opposite polarity located at the respective ends thereof.

Terminals 16 and 18 are electrically connected to respective conductive paths 20 and 22 defined on the surface of printed circuit board 12. Electrical connection between each terminal and its associated conductive path may be effected by respective solder beads 24 and 26. Circuit board 12 may be made from a low-temperature organic material, with the solder often being a low temperature eutectic solder applied by wave or reflow soldering techniques.

The dimensions of RC device 10 may be selected to correspond with a standard size in which discrete MLCs have been produced. According to industry practice, the size of a MLC is generally expressed as a number "XXYY," with XX and YY being the width or length in hundredths of an inch. The side, i.e., width or length, to which the terminals are applied is XX, with YY expressing the other dimension. Some typical sizes under this practice are 1206, 1210, 0805, 0603 and 1812. Aspect ratios (defined as the ratio of the height to the longer of the width or the length) of less than 1:1, and often less than 0.5:1, are not uncommon.

Figure 1A:
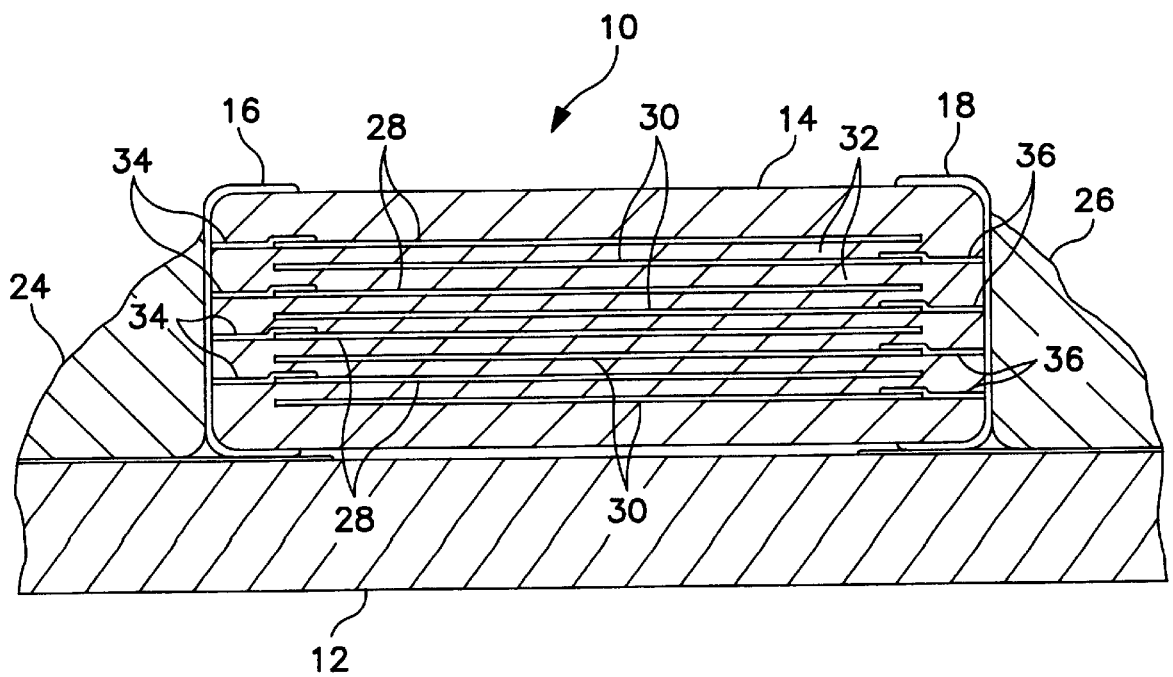
FIG. 1A is a cross-sectional view as taken along line 1A—1A of FIG. 1.

Referring now to FIG. 1A, the internal construction of body 14 will be explained. Like a MLC of the prior art, body 14 includes a plurality of first electrode plates 28 interleaved in opposed and spaced apart relation with a plurality of second electrode plates 30. The electrode plates are separated by layers (such as layers 32) of ceramic material to provide a predetermined dielectric constant.

In a MLC, each set of alternate electrode plates is connected directly to one of the opposite polarity terminals. The connection between each electrode plate 28 and terminal 16, however, is achieved through a respective resistive element 34. Resistive elements 36 likewise provide electrical connection between terminal 18 and respective electrode plates 30.

Figure 1B:
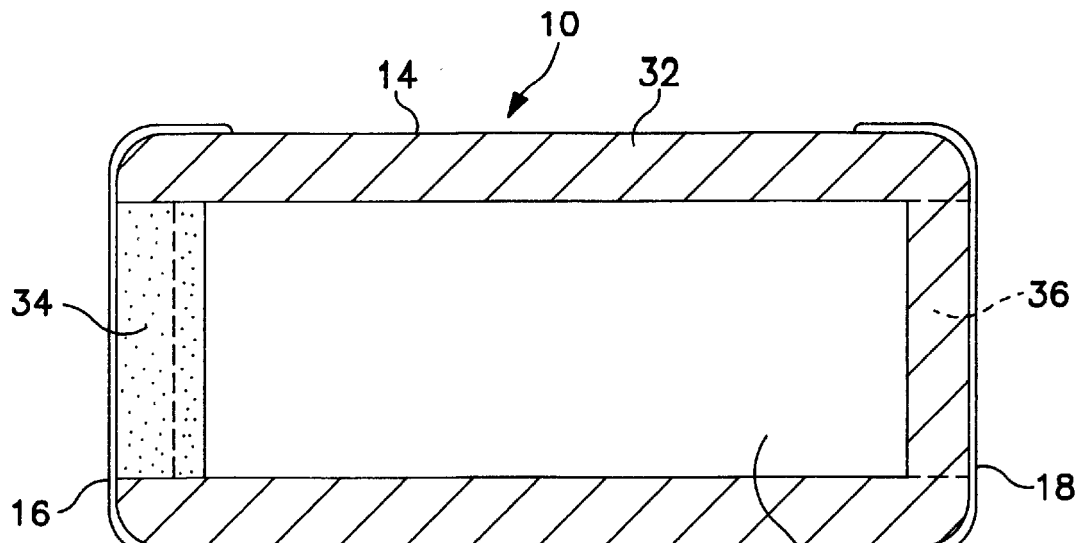
FIG. 1B is a cross-sectional view taken along line 1B—1B of FIG. 1.

FIG. 1B illustrates in greater detail the relationship between a respective electrode plate 28 and its associated resistive element 34. As can be seen, electrode plate 28 is located on ceramic layer 32 and sized such that a border of ceramic remains on all sides. Resistive element 34 overlies a portion of plate 28, and from there extends to terminal 16. It will be appreciated that each plate 30 and its associated resistive element 36 are similarly arranged but connected to terminal 18.

Figure 1C:
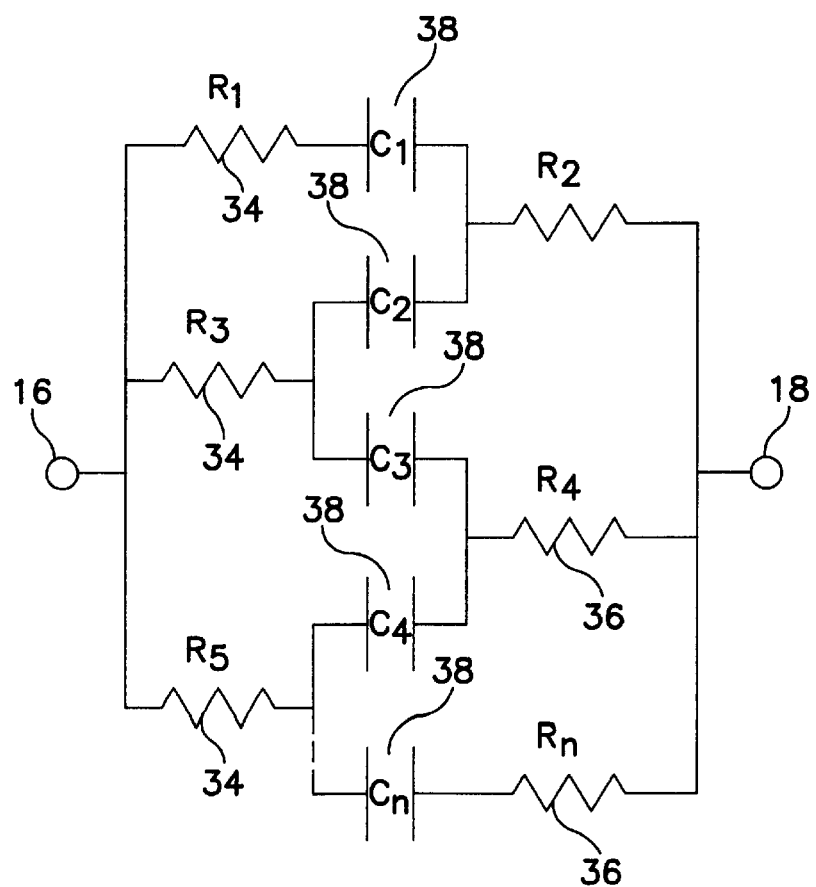
FIG. 1C is an electrical schematic showing the circuit of the composite RC device of FIG. 1.

The electrical operation of RC device 10 can be most easily explained with reference to FIG. 1C. As shown, opposing electrode plates 28 and 30 form a plurality of two-plate capacitors 38 (here designated as capacitors $C_1$ through $C_n$ respectively). Resistors 34 are located on one electrical side of each capacitor 38, such that odd numbered resistors $R_1$, $R_3$, $R_5$, etc. electrically connect this side of the capacitor structure to terminal 16. Resistors 36 are located on the opposite electrical side of capacitors 38, whereby terminal 18 is electrically connected to this side of the capacitor structure via even numbered resistors $R_2$, $R_4$, $R_n$, etc.

It will be appreciated that the resulting circuit functions as a series RC arrangement. The corner frequency of the overall circuit will be defined by the expression:

$$f=1/(2*\pi*R_T*C_T)$$

where $R_T$ and $C_T$ represent the overall resistance and capacitance of the device, respectively. Due to its parallel nature, the device can be made with fewer or greater layers without theoretically changing the corner frequency. Alterations in the number of layers will change the values of $R_T$ and $C_T$ however, resulting in changes in the device's impedance.

Figure 2:
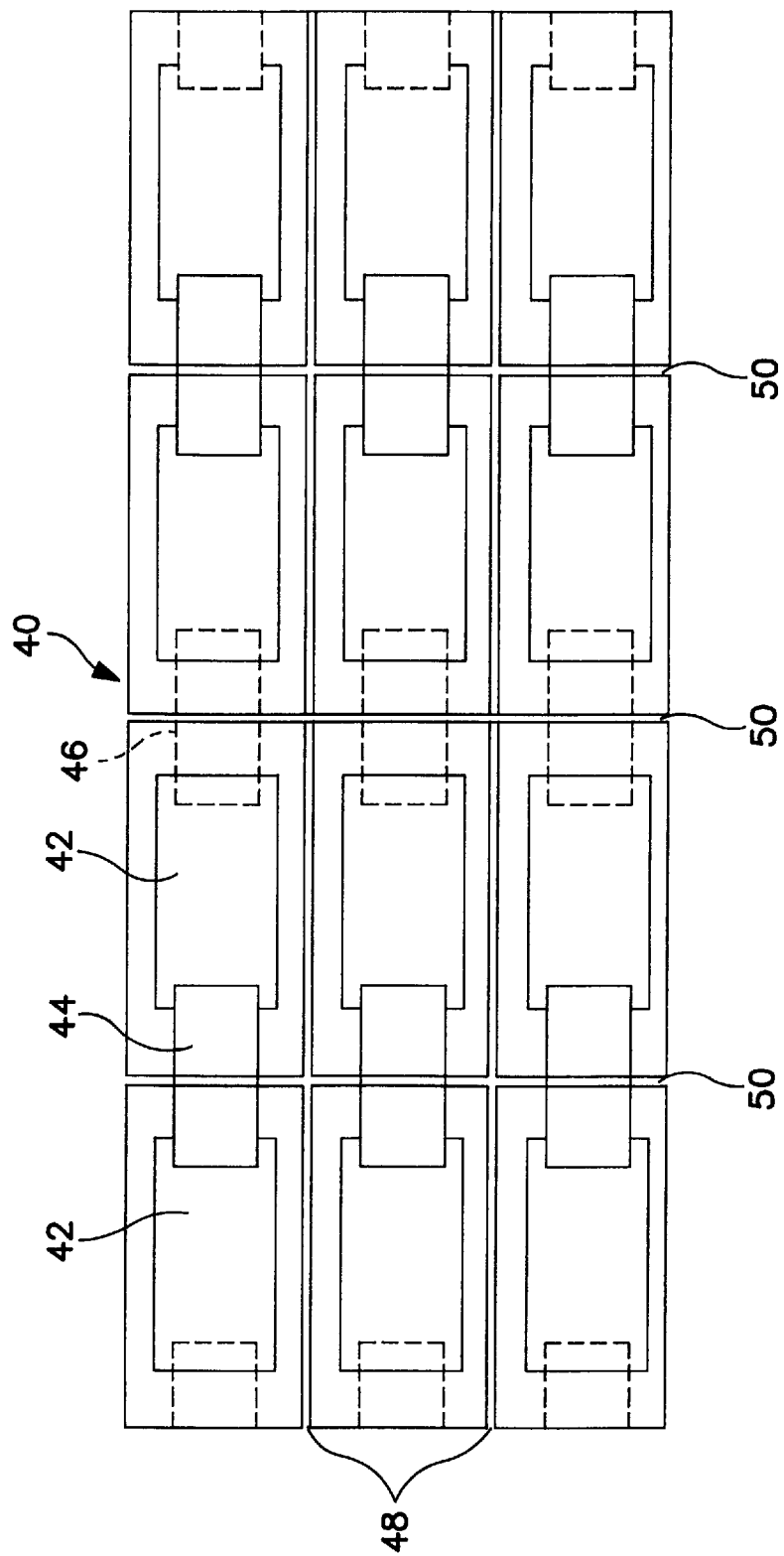
FIG. 2 is a plan view illustrating a plurality of composite RC devices during fabrication.

Referring now to FIG. 2, RC device 10 is preferably manufactured utilizing multilayer ceramic techniques. In particular, a "green" ceramic tape 40 is first printed with a plurality of electrode plates, such as plates 42, typically utilizing an Ag or Ag/Pd ink. Resistive ink is next applied between alternating pairs of electrode plates to produce respective resistors, such as resistor 44. Layers of the tape are then stacked such that electrode plates of each additional layer will overlay plates of the layer below to form a capacitor structure. The resistive ink of adjacent layers, however, will be located on opposite electrical sides of the capacitor structure. In many cases, this results in a configuration wherein respective resistors of adjacent layers are aligned with one another on opposite sides of the electrode plates, as can be seen by noting the relationship between resistor 44 and underlying resistor 46.

After the stack has been formed in this manner, the green tape is pressed and sintered. Thus, the ceramic layers and resistive ink are fired together to produce a substantially unitary structure. Typical prior art MLC devices generally utilize high-temperature ceramics that often require firing temperatures in excess of 1100 degrees Celsius. Such temperatures, however, are unsuitable with resistive inks of the type preferably utilized to form the resistors of the present invention. As such, device 10 preferably utilizes a LTCC having a firing temperature of less than approximately 850 degrees Celsius. Suitable LTCC materials are available from Ferro Corporation of Santa Barbara, CA and DuPont Photopolymer & Electronic Materials of Research Triangle Park, N.C.

After firing, the ceramic stack is cut, or "diced," along longitudinal and transverse lines, as indicated at 48 and 50, to form the individual device bodies. Opposite polarity terminals as described above are then applied to the exterior of each device body, typically using known thick film techniques.

The resistance associated with each pair of electrodes of RC device 10 will be equal to the sum of resistors on each electrical side. As a result, the total resistance does not significantly change as the electrode position is shifted from center. Thus, slight misregistrations during the dicing procedure will not significantly affect the electrical characteristics of the overall device.

Figure 3A:
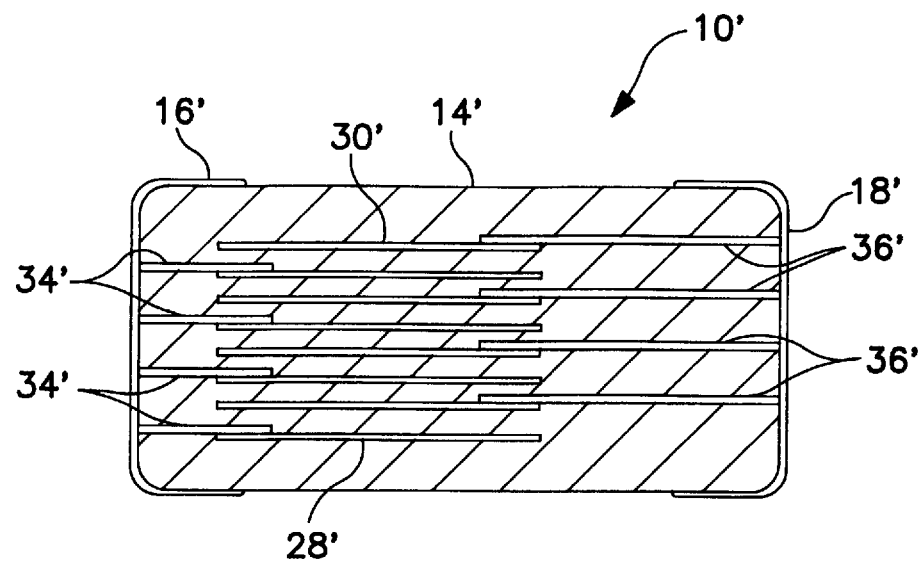
FIGS. 3A and 3B are cross-sectional views showing the internal configuration of a composite RC device as in FIG. 1 upon the occurrence of dicing misregistration in respective left and right directions.
Figure 3B:
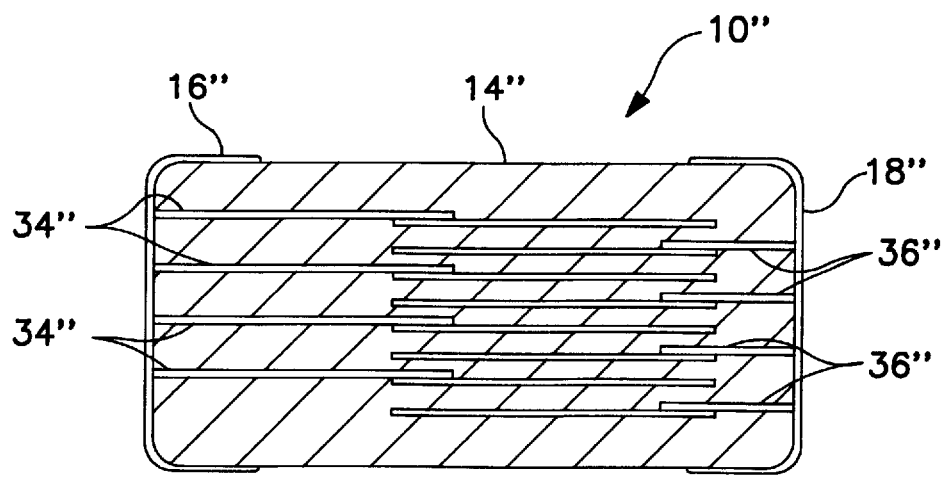

For example, FIG. 3A illustrates a device 10' in which plates 28' and 30' are shifted left with respect to their ideal center position. As a result, the length of resistors 34' has been shortened, causing a concomitant decrease in resistance. This resistive decrease is counterbalanced, however, by a corresponding increase in the length (and hence resistance) of resistors 36'. Similarly, a right shift as shown in FIG. 3B produces an increase in the resistance of resistors 34" and a compensating decrease in the resistance of resistors 36".

Although not utilized in all embodiments of the present invention, a multiple parallel resistor structure as described above is advantageous to generally achieve a more consistent resistance value in the RC device. In particular, undesired unit-to-unit variations in nominal resistance can often be produced during manufacture of a single resistor. For example, the thickness or width of the resistive ink may vary slightly from one unit to the next. In a multiple parallel resistor structure, however, the overall resistance will tend to achieve a more predictable average value.

Additional embodiments of the present invention will now be described with reference to the remaining drawings. One skilled in the art will appreciate that many aspects of the following embodiments will be similar to RC device 10. For the sake of brevity, reference is made to the discussion above for such similar aspects.

Figure 4A:
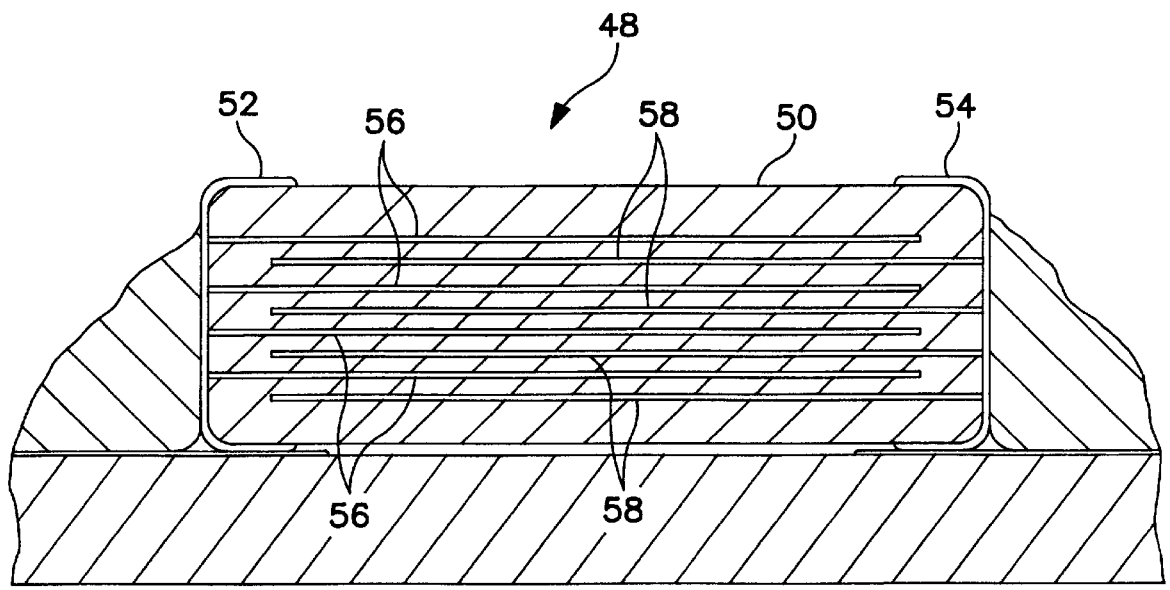
FIGS. 4A and 4B are cross-sectional views taken along similar lines as FIGS. 1A and 1B illustrating a first alternative embodiment of a composite RC device constructed in accordance with the present invention.
Figure 4B:
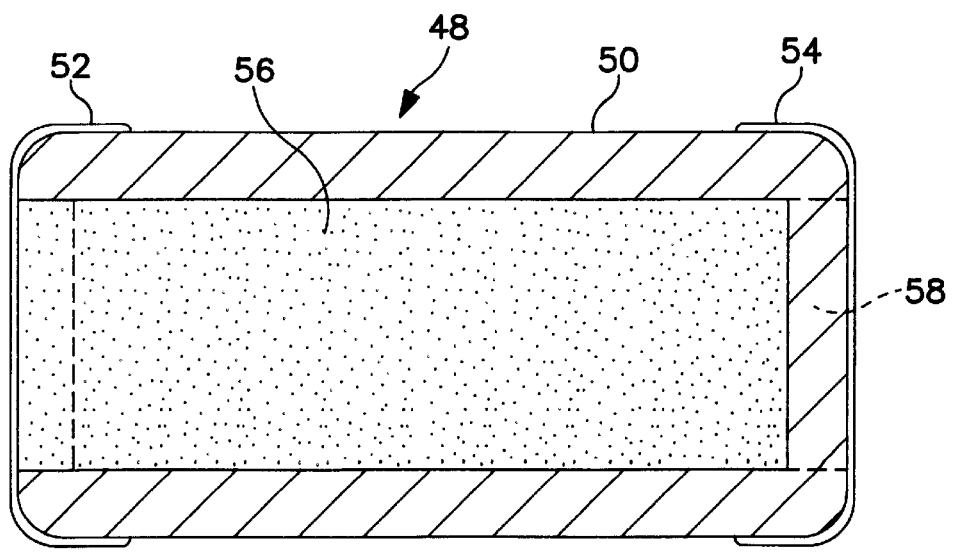

Thus, FIGS. 4A and 4B illustrate an alternative RC device 48 having a device body 50 on which opposite polarity terminals 52 and 54 are located. As shown, a plurality first plates 56 are electrically connected to terminal 52. A plurality of second plates 58, interleaved with plates 56, are electrically connected to terminal 54.

Instead of discrete R and C elements, the plates themselves are constructed entirely from resistive material in this case. For example, as shown in FIG. 4B, plates 56 are preferably formed by printing resistive material so as to form an electrode plate that is directly connected to terminal 52. Similarly, plates 58 form an electrode plate directly connected to terminal 54. The resulting structure exhibits the desired RC characteristics. One skilled in the art will appreciate that this technique can be employed with various other embodiments described herein.

Figure 5:
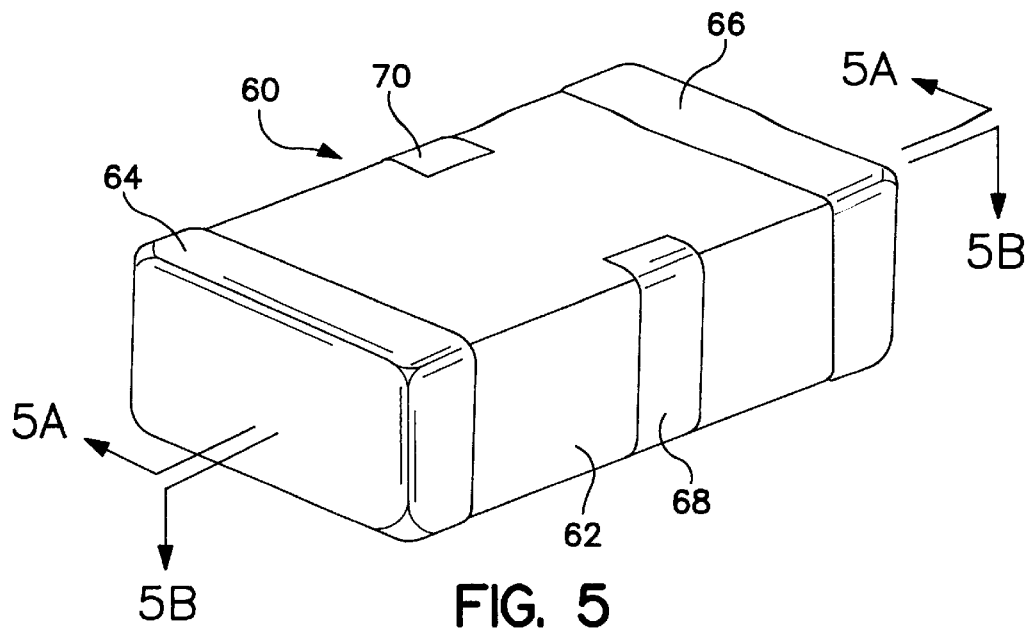
FIG. 5 is a perspective view of a second alternative embodiment of a composite RC device constructed in accordance with the present invention.
Figure 5B:
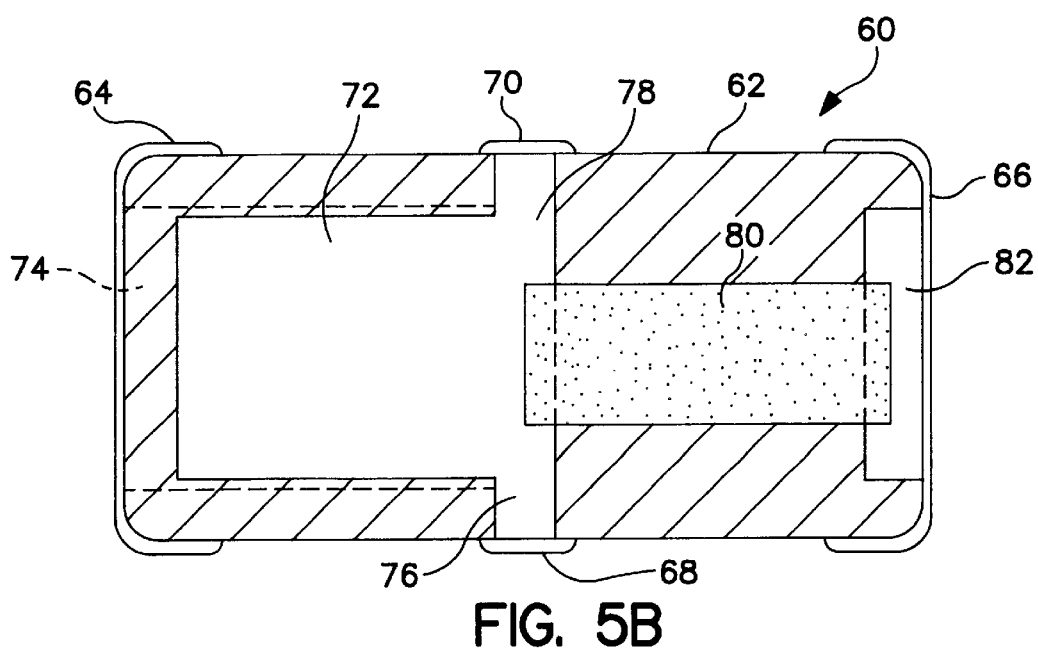
FIG. 5B is a cross-sectional view as taken along line 5B—5B of FIG. 5.
Figure 5A:
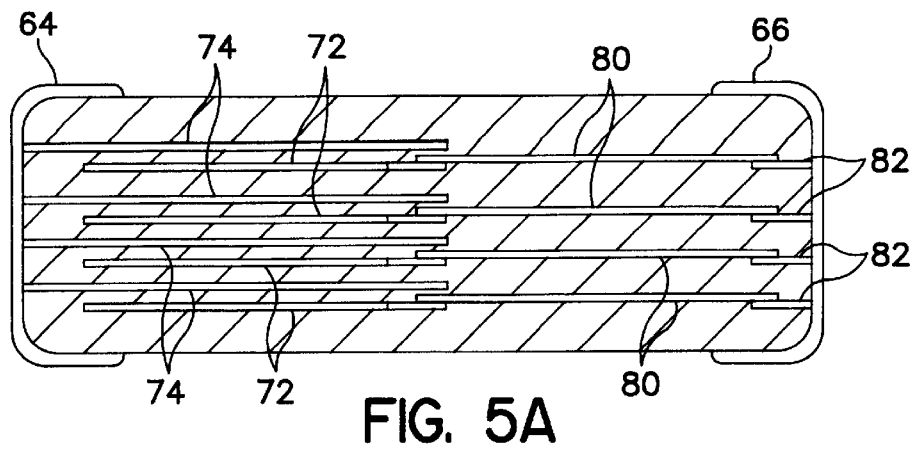
FIG. 5A is a cross-sectional view as taken along line 5A—5A of FIG. 5.

A further alternative embodiment is illustrated in FIG. 5. In particular, FIG. 5 depicts an RC device 60 having a device body 62 on which opposite polarity terminals 64 and 66 are located. In this case, device body further includes a pair of lateral terminals 68 and 70. The internal construction of device 60 can be most easily explained with reference to FIGS. 5A and 5B. As shown, a first set of conductive plates 72 is interleaved with a second set of conductive plates 74. Plates 74 are generally rectangular in configuration, and are electrically connected to terminal 64. Plates 72 each include a generally rectangular electrode portion opposing the overlying plate 74. In addition, plates 72 include a pair of integral lead structures 76 and 78 laterally extending to respective terminals 68 and 70.

Device 60 further includes a plurality of resistors 80 electrically connecting terminal 66 with respective plates 72. In this case, a short leader 82 of conductive material is also provided to effect the final connection to terminal 66.

Figure 5C:
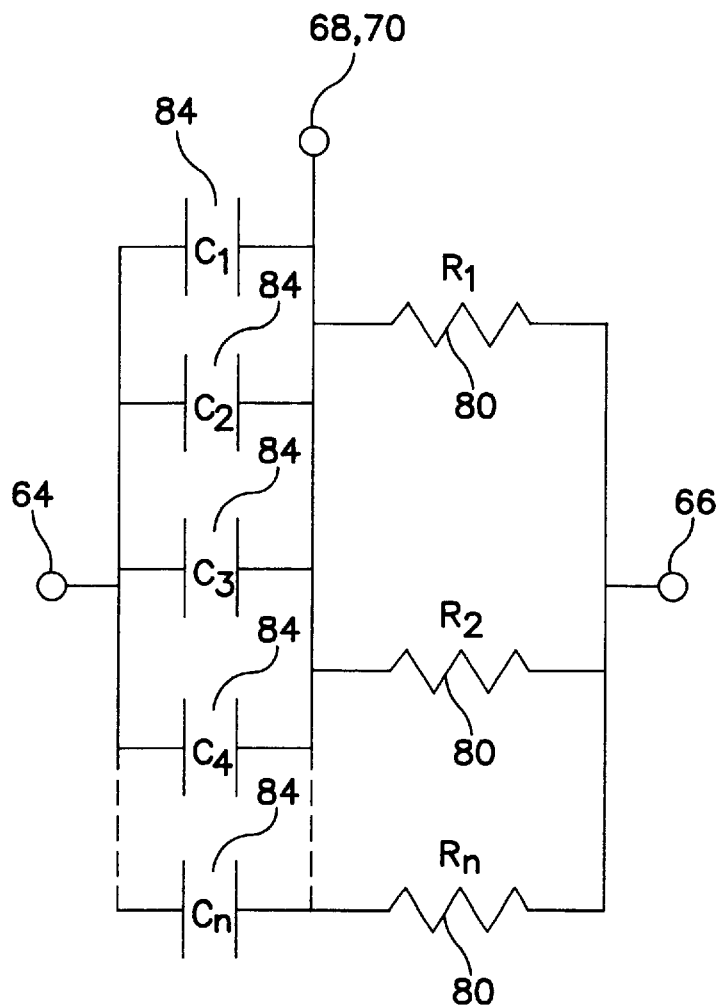
FIG. 5C is an electrical schematic showing the circuit of the composite RC device of FIG. 5.

An electrical schematic of the overall circuit produced by device 60 is shown in FIG. 5C. As can be seen, plates 72 and 74 produce a plurality of two-plate capacitors 84 arranged in parallel as shown. A resistor 80 is located on one electrical side of each capacitor 84, whereby terminal 66 is electrically connected to this side of the capacitor structure via resistors designated $R_1$, $R_2$, $R_n$, etc.

It can be seen that terminals 68 and 70 function as a single electrical terminal, thus allowing a "tap" between the capacitance and the resistance for connection to external circuitry as desired. While two lateral terminals 68 and 70 have been provided in the illustrated embodiment for purposes of convenience, one of skill in the art will appreciate that device 60 may be equipped with only one lateral terminal.

Figure 6:
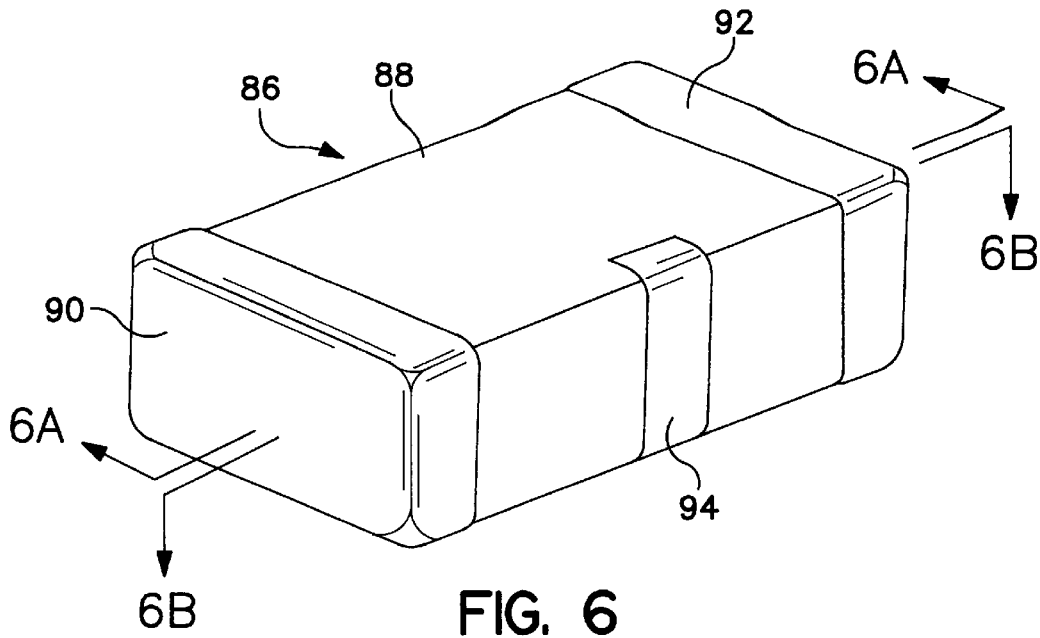
FIG. 6 is a perspective view of a third alternative embodiment of a composite RC device constructed in accordance with the present invention.

Referring now to FIG. 6, a further alternative RC device of the present invention is depicted at 86. Device 86 includes a device body 88 having located thereon opposite polarity terminals 90 and 92. Device body 88 further includes a connecting via 94, resembling a terminal, located on one lateral side thereof.

Figure 6B:
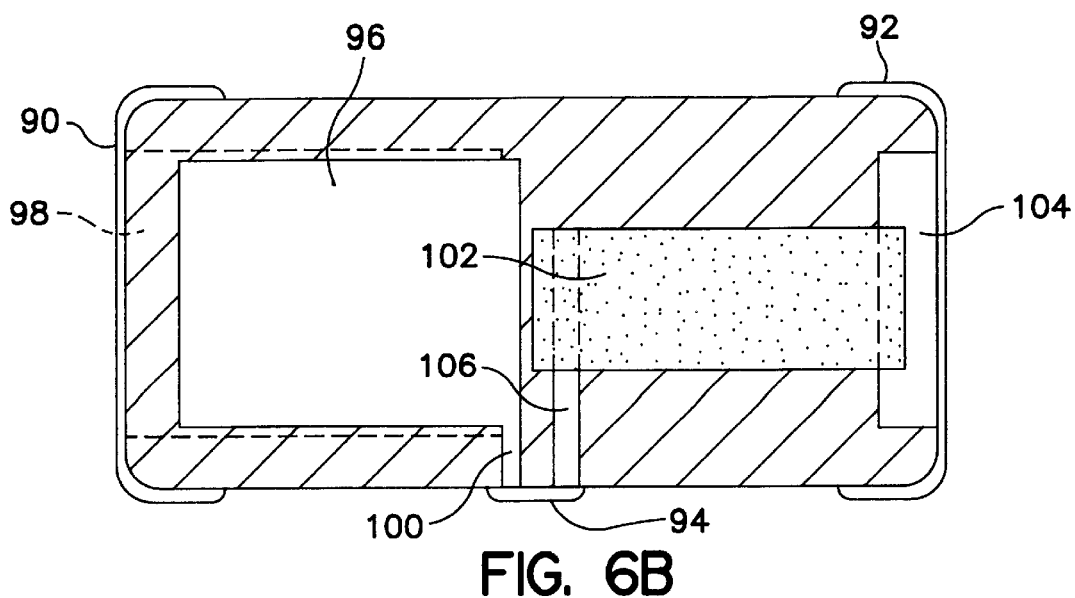
FIG. 6B is a cross-sectional view as taken along line 6B—6B of FIG. 6.
Figure 6A:
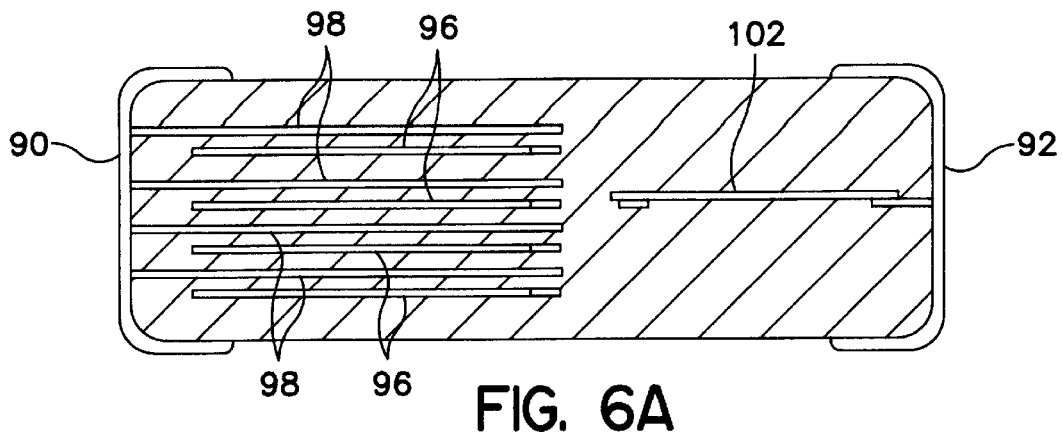
FIG. 6A is a cross-sectional view as taken along line 6A—6A of FIG. 6.

FIGS. 6A and 6B reveal the internal construction of device 86. As shown, a first set of conductive plates 96 is interleaved with a second set of conductive plates 98. Plates 98 are generally rectangular in configuration, and are electrically connected to terminal 90. Each plate 96 includes a generally rectangular electrode portion, as well as an integral lead structure 100 laterally extending to via 94.

Figure 6C:
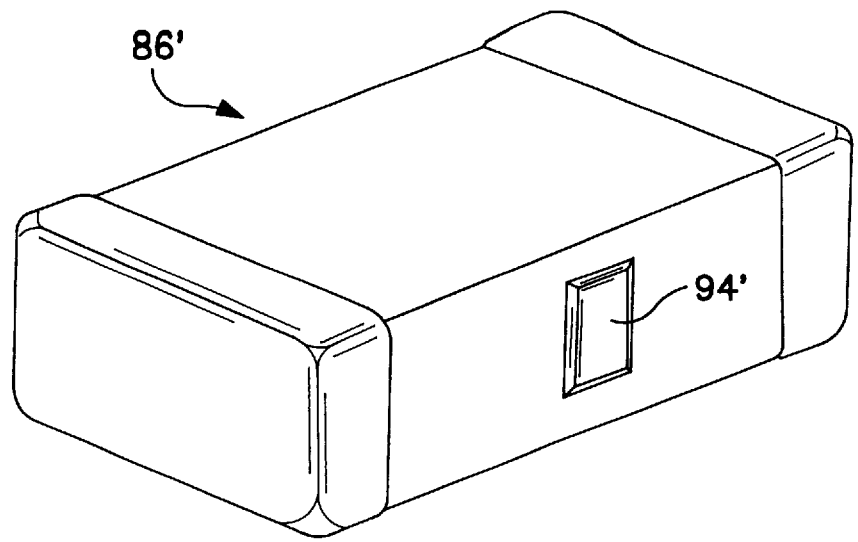
FIG. 6C is a perspective view similar to FIG. 6 wherein the external via connects less than all of the internal capacitor plates into the RC circuit.

Device 86 further includes an embedded resistor 102 electrically connected between terminal 92 and via 94. A short leader 104 is provided to effect the final connection to terminal 92, while a leader 106 extends between via 94 and resistor 102. It will be appreciated that via 94 can be sized to connect resistor 102 to all or less than all of the two-plate capacitors in the capacitor structure. For example, FIG. 6C illustrates an embodiment 86' having a via 94' that connects the internal resistor to less than all of the capacitor plates. As such, the capacitance of the device can be easily adjusted to various discrete values at the time of manufacture.

Figure 6D:
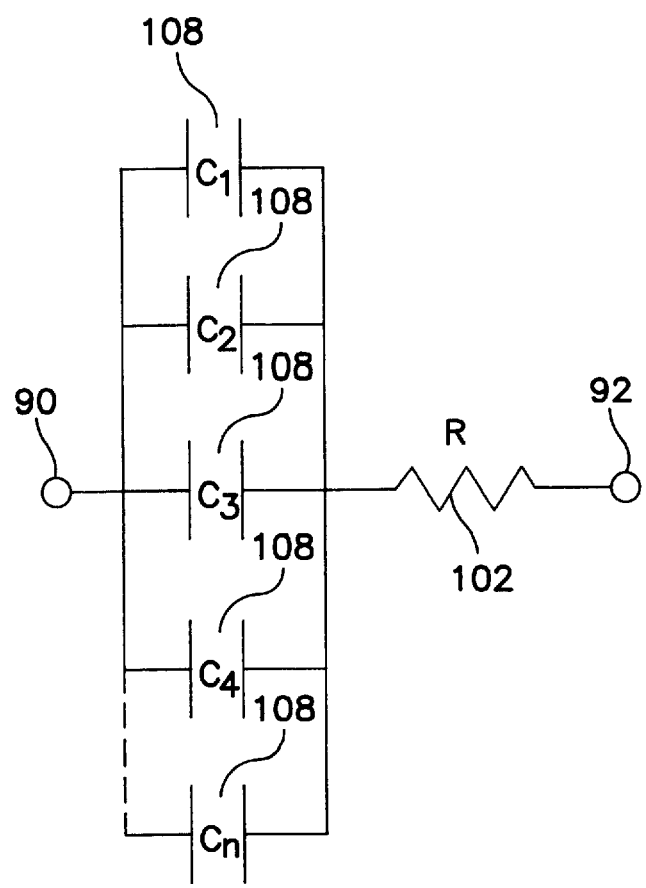
FIG. 6D is an electrical schematic showing the circuit of the composite RC device of FIG. 6.

FIG. 6D shows an electrical schematic of the overall circuit produced by device 86. As can be seen, plates 96 and 98 produce a plurality of two-plate capacitors 108 arranged in parallel as shown. Resistor 80 (designated R) is connected between one or more of the capacitors 108 and terminal 92.

Figure 7:
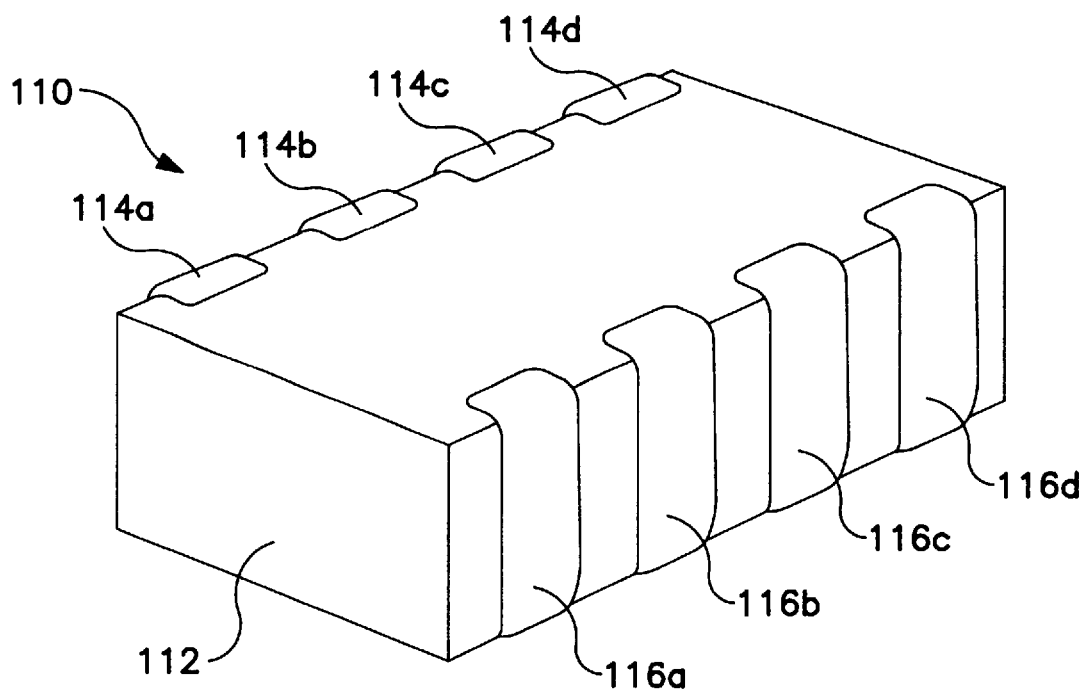
FIG. 7 is a perspective view of an RC array in a singular package constructed in accordance with the present invention.

FIG. 7 illustrates an array 110 of RC circuits of the present invention contained in a singular package. In this case, array 110 is constructed having a total of four electrically separate RC circuits contained within device body 112. Thus, a plurality of first polarity terminals 114*a–d* are located on one lateral side of body 112. Similarly, a plurality of second polarity terminals 116*a–d* are located on the opposite lateral side of body 112.

In this case, the individual RC circuits of array 110 are constructed in a manner similar to the RC circuit of device 10 above. This can be clearly seen in FIGS. 7A and 7B, which illustrate alternating ceramic layers 118 and 120 that can be stacked to form device body 112. As shown, ceramic layer 118 includes four electrode plates 122*a–d* connected to respective terminals 114*a–d* via resistors 124*a–d*. Similarly, respective electrode plates 126*a–d* of ceramic layer 120 are interconnected with terminals 116a-d through resistors 128*a–d*. Alternatively, the electrode plates may be constructed entirely of resistive material in the manner described above with reference to FIG. 4B.

It can thus be seen that the present invention provides improved composite RC devices fabricated by multilayer ceramic technology. While preferred embodiments of the invention have been shown and described, modifications and variations may be made thereto by those of ordinary skill in the art without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to be limitative of the invention so further described in such appended claims.

What is claimed is:

1. A composite RC device comprising:

a device body defined by at least one first ceramic layer and at least one second ceramic layer located on said first ceramic layer;

each said first ceramic layer having first circuitry thereon defining a first series resistance and a first polarity capacitor electrode, said first circuitry comprising a first conductive capacitor plate and a first series resistor electrically connected between said first conductive capacitor plate and said first polarity terminal;

each said second ceramic layer having second circuitry thereon defining a second series resistance and a second polarity capacitor electrode, said second circuitry comprising a second conductive capacitor plate and a second series resistor electrically connected between said second conductive capacitor plate and said second polarity terminal; and first and second polarity terminals located on said device body and electrically connected to said first circuitry and said second circuitry, respectively.

2. A device as set forth in claim 1, wherein said first and second ceramic layers are made from a LTCC material having a firing temperature of less than approximately 850 degrees Celsius.

3. A device as set forth in claim 1, comprising a plurality of first ceramic layers and a plurality of second ceramic layers interleaved to form a stack.

4. A device as set forth in claim 3, wherein said first and second polarity terminals are located opposite to one another across said device body such that said first resistors are aligned with said second resistors.

5. A composite RC device comprising:

a device body defined by at least one first ceramic layer and at least one second ceramic layer located on said first ceramic layer;

each said first ceramic layer having first circuitry thereon defining a first series resistance and a first polarity capacitor electrode;

each said second ceramic layer having second circuitry thereon defining a second series resistance and a second polarity capacitor electrode;

first and second polarity terminals located on said device body and electrically connected to said first circuitry and said second circuitry, respectively; and wherein said first circuitry and said second circuitry each comprise a resistive material electrically connected to a respective of said first and second terminals and including an electrode plate configuration.

6. A device as set forth in claim 5, comprising a plurality of first ceramic layers and a plurality of second ceramic layers interleaved to form a stack.

7. A composite RC device, said device comprising:

a device body defined by a plurality of first ceramic layers and a plurality of second ceramic layers interleaved to form a stack;

each of said first ceramic layers having a respective first electrode thereon and each of said second ceramic layers having a second electrode thereon, said first electrodes and said second electrodes being opposed to define a multilayer parallel capacitor structure;

first and second polarity terminals located on said device body;

a plurality of first resistors embedded in said device body between an adjacent pair of first and second ceramic layers, said first resistors being electrically connected between said first polarity terminal and respective of said first electrodes; and a plurality of second resistors each being electrically connected between said second polarity terminal and one of said second electrodes.

8. A device as set forth in claim 7, wherein said first and second ceramic layers are made from a LTCC material having a firing temperature of less than approximately 850 degrees Celsius.

9. An array device having a predetermined number of RC circuits in a singular package, said array device comprising:

a device body defined by a plurality of first ceramic layers and a plurality of second ceramic layers interleaved to form a stack;

each of said first ceramic layers having said predetermined number of first electrodes thereon and each of said second ceramic layers having said predetermined number of second electrodes thereon, said first electrodes being opposed to respective of said second electrodes to define respective multilayer parallel capacitor structures;

a respective first polarity terminal and a respective second polarity terminal for each of said RC circuits, said first polarity terminals and said second polarity terminals being located on said device body;

a plurality of first resistors for each of said RC circuits, said first resistors embedded in said device body between an adjacent pair of first and second ceramic layers, said first resistors each being electrically connected between said first polarity terminal and one of said first electrodes; and a plurality of second resistors for each of said RC circuits, said second resistors each being electrically connected between said second terminal and one of said second electrodes.

10. A device as set forth in claim 9, wherein said first and second ceramic layers are made from a LTCC material having a firing temperature of less than approximately 850 degrees Celsius.

11. A composite RC device comprising:

device body defined by a plurality of first ceramic layers and a plurality of second ceramic layers interleaved to form a stack;

each of said first ceramic layers having a respective first electrode thereon and each of said second ceramic layers having a second electrode thereon, said first electrodes and said second electrodes being opposed to define a multilayer parallel capacitor structure;

first and second polarity terminals located on said device body;

a plurality of first resistors embedded in said device body between an adjacent pair of first and second ceramic layers, said first resistors each being electrically connected between said first polarity terminal and one of said first electrodes; and wherein each of said first electrodes further comprises at least one lead structure extending therefrom, said lead structure being electrically connected to a third terminal located on said device body, said third terminal providing a tap between resistance and capacitance provided by said composite RC device.

12. A device as set forth in claim 11, wherein said second polarity terminal is electrically connected directly to said second electrodes.

13. A composite RC device comprising:

a device body defined by a plurality of first ceramic layers and a plurality of second ceramic layers interleaved to form a stack;

each of said first ceramic layers having a respective first electrode thereon and each of said second ceramic layers having a second electrode thereon, said first electrodes and said second electrodes being opposed to define a multilayer parallel capacitor structure;

first and second polarity terminals located on said device body;

at least one first resistor embedded in said device body between an adjacent pair of first and second ceramic layers, said at least one first resistor being electrically connected between said first polarity terminal and at least one of said first electrodes; and wherein said at least one first resistor is electrically connected to a connecting via located on said device body, said connecting via being further electrically connected to said at least one of said first electrodes such that a predetermined capacitance is provided.

14. A device as set forth in claim 13, wherein said connecting via is electrically connected to a plurality of said first electrodes.

15. A device as set forth in claim 14, wherein each of said first electrodes includes a respective lead structure extending to said connecting via.

16. A method of fabricating a composite RC device, said method comprising steps of:

(a) providing a plurality of first layers of ceramic material, each of said first layers having first circuitry thereon defining a first electrode and a first resistive element;

(b) providing a plurality of second layers of ceramic material, each of said second layers having second circuitry thereon defining a second electrode and a second resistive element;

(c) stacking said first layers and said second layers to define an interleaved device body such that said first electrodes and said second electrodes alternate;

(d) providing first and second opposite polarity electrodes on said device body and electrically connected to said first circuitry and said second circuitry, respectively.

17. A method as set forth in claim 16, further comprising the step of firing said device body at a selected temperature prior to application of said electrodes to achieve a substantially unitary structure.

18. A method as set forth in claim 16, wherein said selected temperature is less than approximately 850 degrees Celsius.

19. A method as set forth in claim 16, wherein said first electrode and said first resistive element are discrete circuit elements.

20. A method as set forth in claim 16, wherein said first electrode and said first resistive element are formed by a unitary circuit element.

21. An array device having a predetermined number of RC circuits in a singular package, said array device comprising:

a device body defined by a plurality of first ceramic layers and a plurality of second ceramic layers interleaved to form a stack;

each of said first ceramic layers having a predetermined number of first resistive plates thereon and each of said second ceramic layers having a predetermined number of second resistive plates thereon; and said first resistive plates being opposed to said second resistive plates to define respective multilayer structures exhibiting RC characteristics.

22. A device as set forth in claim 21, wherein said first and second ceramic layers are made from a LTCC material having a firing temperature of less than approximately 850 degrees Celsius.

23. A composite RC device comprising:

a device body defined by a plurality of first ceramic layers and a plurality of second ceramic layers interleaved to form a stack, said first and second ceramic layers being made from a LTCC material having a firing temperature of less than approximately 850 degrees Celsius;

each said first ceramic layer having first circuitry thereon defining a first series resistance and a first polarity capacitor electrode;

each said second ceramic layer having second circuitry thereon defining a second series resistance and a second polarity capacitor electrode; and first and second polarity terminals located on said device body and electrically connected to said first circuitry and said second circuitry, respectively.

24. A device as set forth in claim 23, wherein said first circuitry comprises a first conductive capacitor plate and a first series resistor electrically connected between said first conductive capacitor plate and said first polarity terminal, and said second circuitry comprises a second conductive capacitor plate and a second series resistor electrically connected between said second conductive capacitor plate and said second polarity terminal.

25. A device as set forth in claim 23, wherein said first circuitry and said second circuitry each comprise a resistive material including an electrode plate configuration, said resistive material of said first circuitry being electrically connected to said first terminal and said resistive material of said second circuitry being electrically connected to said second terminal.

* * * * *